United States Patent
Miyakawa (10) Patent No.: US 6,735,753 B2
(45) Date of Patent: May 11, 2004

(54) METHOD OF FABRICATING A SEMICONDUCTOR DEVICE HAVING A MULTILEVEL INTERCONNECTIONS

(75) Inventor: Yasuhiro Miyakawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 13 days.

(21) Appl. No.: 10/263,764

(22) Filed: Oct. 4, 2002

(65) Prior Publication Data

US 2004/0068710 A1 Apr. 8, 2004

(51) Int. Cl.$^7$ ............................................. G06F 17/50
(52) U.S. Cl. .................... 716/11; 716/8; 716/1
(58) Field of Search ........................ 716/11, 8, 1; 703/5

(56) References Cited

U.S. PATENT DOCUMENTS 6,028,324 A * 2/2000 Su et al. ..................... 257/48
6,109,775 A 8/2000 Tripathi et al.

OTHER PUBLICATIONS

K. Miyamoto et al., "Impact of Pattern Density on Plasma Damage of CMOS LSIs," 1996 IEEE, pp. IEDM 96-739—IEDM 96-742.

W. Lukaszek et al., "Quantifying Via Charging Currents," 2nd International Symposium on Plasma Process–Induced Damage, 4 pages.

* cited by examiner

Primary Examiner—Vuthe Siek
Assistant Examiner—Sun James Lin
(74) Attorney, Agent, or Firm—Volentine Francos, PLLC (57) ABSTRACT

In a method of fabricating a semiconductor device, first metal interconnection patterns, first via patterns and second metal interconnection patterns are positioned in such a way that each of antenna ratios of the first metal patterns, the first via patterns and the second metal patterns becomes equal to or smaller than an allowable antenna ratio. Next, a width of each of the first metal patterns is broadened by a minimum line width of the first metal patterns. The broadened first metal patterns are connected at a first area where a distance between the broadened first metal patterns is smaller than a minimum size of the first via patterns. Then, a second area is extracted where the first metal patterns and the second metal patterns do not exist. Additional first via patterns are placed in the second area. Each of the additional first via patterns has a minimum size with a minimum pitch in the second area. Finally, the additional first via pattern which do not meet a minimum allowable distance between the first metal patterns and the first via patterns is deleted.

14 Claims, 6 Drawing Sheets

METHOD OF FABRICATING A SEMICONDUCTOR DEVICE HAVING A MULTILEVEL INTERCONNECTIONS

BACKGROUND OF THE INVENTION

The present invention relates to a semiconductor device that ensures a reduction in a process-induced damage (hereinafter abbreviated as "PID") in a multilevel interconnection process.

According to the related art technology in the field, a semiconductor device is designed by the following method.

A logic circuit which satisfies a given operation is laid out with a device isolation pattern, an impurity doping pattern, a gate electrode pattern, a contact hole pattern and a first metal interconnection pattern. The first metal interconnection pattern is so designed that its antenna ratio becomes equal to or smaller than an allowable antenna ratio.

Then, a first via pattern for connecting the first metal interconnections to the second metal interconnections is laid out. The first via pattern is so designed that its antenna ratio becomes equal to or smaller than the allowable antenna ratio.

A second metal interconnection pattern is then laid out. The second metal interconnection pattern is so designed that its antenna ratio becomes equal to or smaller than the allowable antenna ratio.

The semiconductor device is designed by repeating the second stage and third stage until a predetermined number of interconnection levels is reached.

The disclosed method of the related art could not however completely prevent a PID-oriented variation in transistor characteristic or deterioration of the characteristic. The problem is reported in detail in "Impact of pattern density on plasma damage of CMOS LSIs, K. MIYAMOTO et al., Technical digest of International Electron Devices Meeting, pp. 739–742, 1996". The problem will be elaborated hereunder according to the reference document.

The numbers of defective transistors generated on SRAM test chips were examined with respect to Random Logic A, Random Logic B and RAM and came out in the order of Random Logic A>Random Logic B>RAM. An antenna ratio, a typical PID index, was also studied for each of the three functional elements. The antenna ratios came out in the order of Random Logic A>RAM>Random Logic B. Apparently, the tendency of the antenna ratio did not match with the tendency of the number of defective transistors. It is to be noted that the antenna ratio is calculated in terms of interconnections and vias and is equal to the interconnection side area divided by the transistor area and the via bottom area divided by the transistor area. The pattern ratios of the functional elements were in the order of RAM>Random Logic A>Random Logic B. It was concluded from the above that the PID was a function of the antenna ratio and the pattern ratio and the larger the antenna ratio was and the smaller the pattern ratio was, the easier the generation of the PID became.

The influence of the pattern ratio on the PID was also reported in "Quantifying Via Charging Currents, Wes Lukaszek et al., Proceedings of 2nd International Symposium on Plasma Process-Induced Damage, pp. 123–126, 1997". The following is the specific discussion on the influence given in the document.

For vias of size 1.5 $\mu$m and different density levels 1/1600 (/$\mu$m$^2$) for v1, 1/400 (/$\mu$m$^2$) for v4, 1/100 (/$\mu$m$^2$) for v16, and 1/25 (/$\mu$m$^2$) for v64 the voltage dependency of the current density was examined by a charge-flux sensor. It was confirmed that the current density increased only for the density level of v1 among the four density levels.

SUMMARY OF THE INVENTION

As apparent from the two documents, it is necessary to pay attention to both the antenna ratio and the pattern density in order to suppress the PID. Accordingly, it is an object of the invention to provide a method of fabricating a semiconductor device, which can suppress the PID in consideration of the influences of the antenna ratio and the pattern density.

In a method of fabricating a semiconductor device of the present invention, first metal interconnection patterns (M1a), first via patterns (V1a) and second metal interconnection patterns (M2a) are positioned in such a way that each of antenna ratios of the first metal patterns, the first via patterns and the second metal patterns becomes equal to or smaller than an allowable antenna ratio. Next, a width of each of the first metal patterns (M1a) is broadened by a minimum line width of the first metal patterns to form broadened first metal patterns (M1b). The broadened first metal patterns (M1b) are connected at a first area where a distance between the broadened first metal patterns is smaller than a minimum size of the first via patterns (V1a) o form modified first metal patterns (M1c). Then, a second area is extracted where the first metal patterns (M1c) and the second metal patterns (M2a) do not exist. Additional first via patterns are placed in the second area. Each of the additional first via patterns (V1b) has a minimum size with a minimum pitch in the second area. Finally, the additional first via pattern which do not meet a minimum allowable distance between the first metal patterns (M1c) and the first via patterns is deleted to form the finally additional first via patterns (V1c). After all of the above data processes are conducted, the first metal patterns are fixed at M1a and the first via patterns are fixed at V1a+V1c.

DETAILED DESCRIPTION OF THE PREFERRED EMBODIMENTS

Figure 1A:
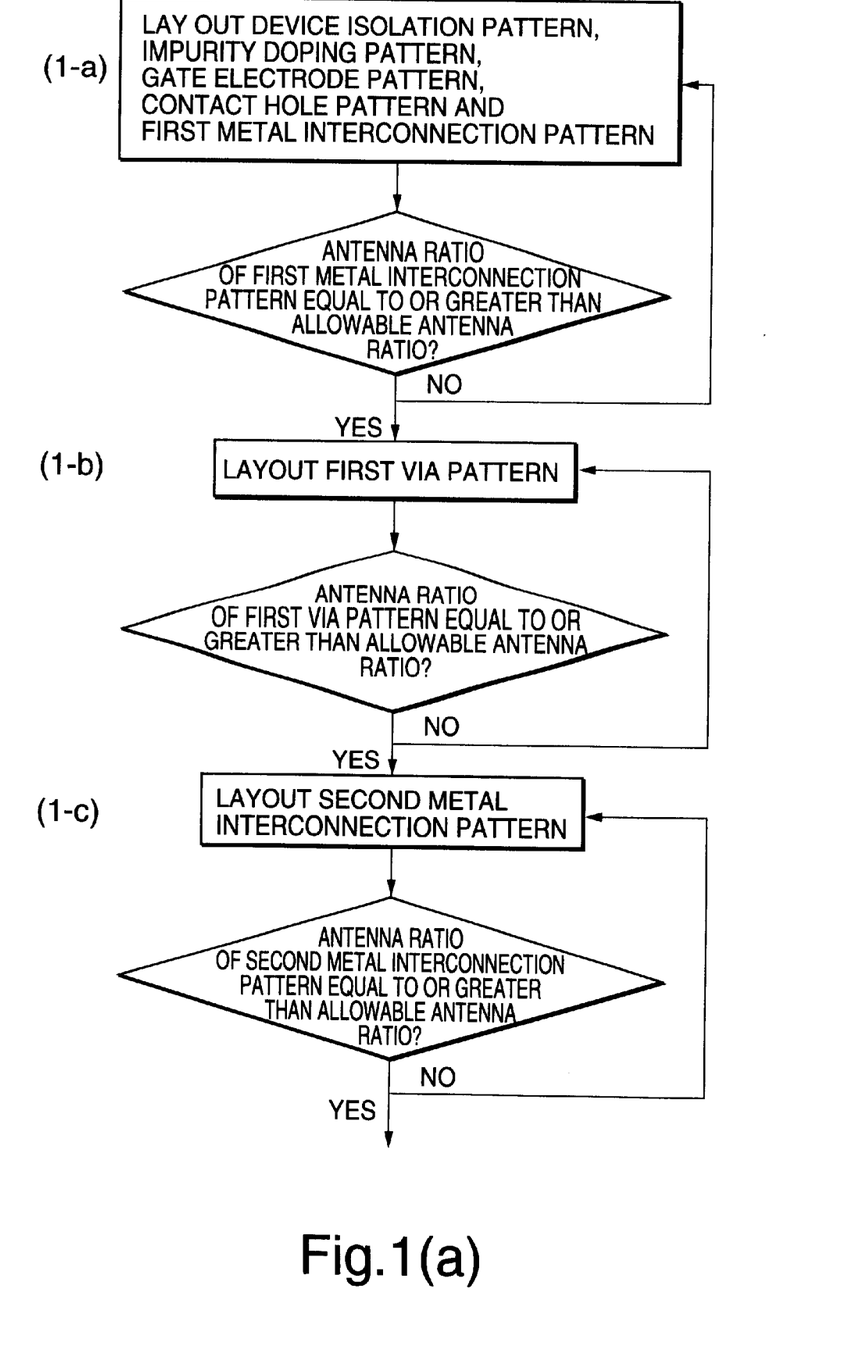
FIGS. 1A and 1B are flowcharts illustrating a first embodiment of the invention.
Figure 1B:
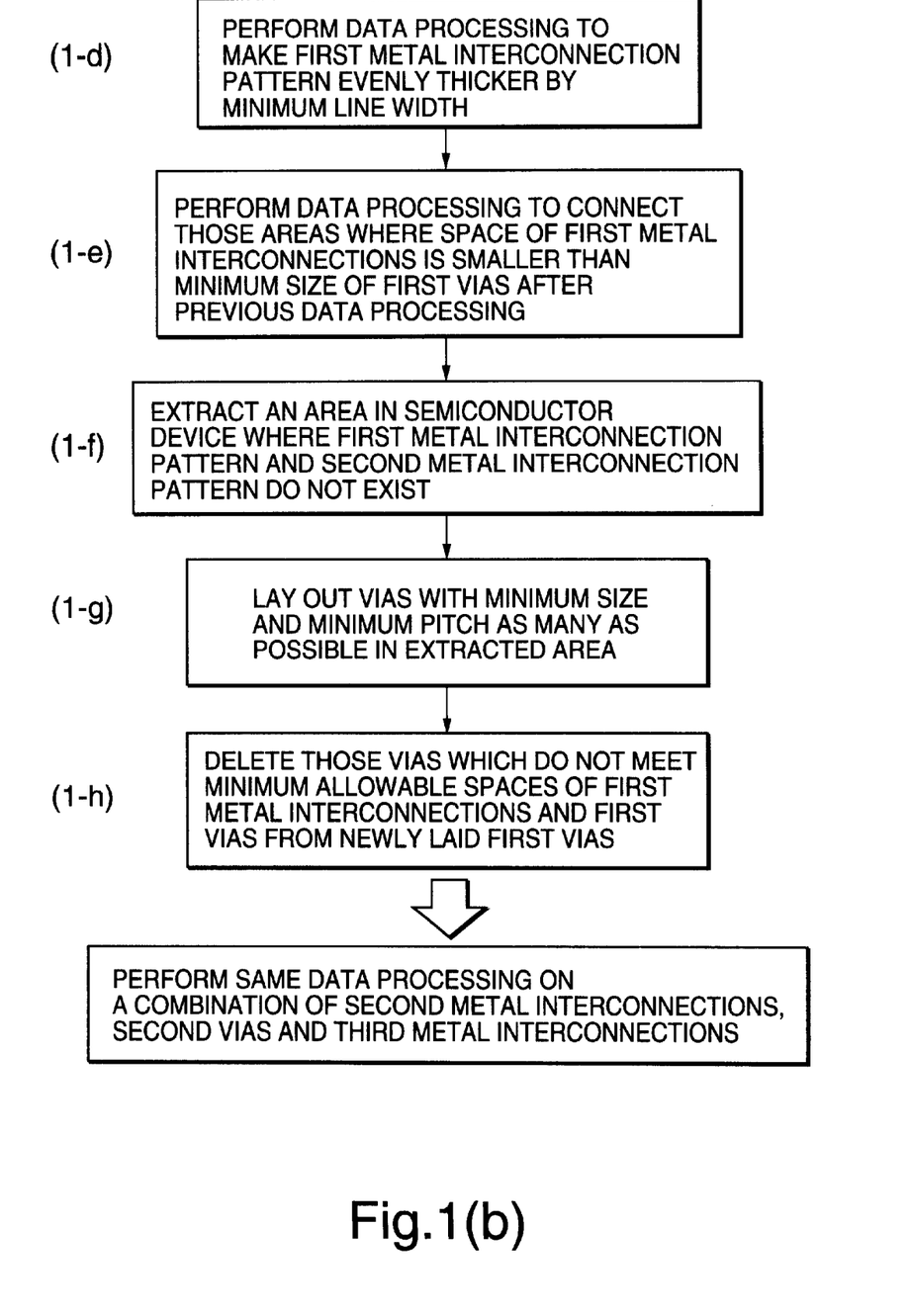

FIGS. 1A and 1B illustrate the first embodiment of the invention. The embodiment will now be described with reference to those drawings.

(1-a) A logic circuit which satisfies a given operation is laid out with a.device isolation pattern, an impurity doping pattern, a gate electrode pattern, a contact hole pattern and a first metal interconnection pattern. The first metal interconnection pattern is so designed that its antenna ratio becomes equal to or smaller than an allowable antenna ratio.

(1-b) Then, a first via pattern for connecting the first metal interconnections to the second metal interconnections is laid out. The first via pattern is so designed that its antenna ratio becomes equal to or smaller than the allowable antenna ratio.

(1-c) A second metal interconnection pattern is then laid out. The second metal interconnection pattern is so designed that its antenna ratio becomes equal to or smaller than the allowable antenna ratio.

(1-d) Data processing is performed to make the first metal interconnection pattern evenly wider by the minimum line width of the first metal interconnections.

(1-e) Data processing is performed to connect the first metal interconnections at those areas where the distance of the first metal interconnections after the first data processing is smaller than the minimum size of first vias.

(1-f) After the second data processing, an area in a semiconductor device where the first metal interconnection pattern and the second metal interconnection pattern do not exist is extracted.

(1-g) Vias with the minimum size and minimum pitch are laid out as many as possible in the extracted area.

(1-h) Those vias which do not meet the minimum allowable distances of the first metal interconnections and the first vias are deleted from the newly laid first via pattern.

Finally, in the first embodiment, the first metal interconnection patterns are fixed at the one in the first stage, and the first via patterns are fixed at the summation of the one in the second stage and the one obtained from the sixth to the seventh stages.

The semiconductor device is designed by repeating the second stage to the eighth stage until a predetermined number of interconnection levels is reached.

As the first embodiment designs a semiconductor device through the following stages, the embodiment can completely suppress the PID without sacrificing the characteristic of the semiconductor device.

(1) Stage at which the first metal interconnection pattern, first via pattern and second metal interconnection pattern are laid out in such a way that the antenna ratios become equal to or smaller than the allowable antenna ratio.

(2) Stage at which data processing is performed to make the first metal interconnection pattern evenly wider by the minimum line width of the first metal interconnections.

(3) Stage at which data processing is performed to connect the first metal interconnections at those areas where the distance of the first metal interconnections after the first data processing is smaller than the minimum size of first vias.

(4) Stage at which an area in a semiconductor device where the first metal interconnection pattern and the second metal interconnection pattern do not exist is extracted after the second data processing.

(5) Stage at which vias with the minimum size and minimum pitch are laid out as many as possible in the area extracted in (4).

(6) Stage at which those vias which do not meet the minimum allowable distances of the first metal interconnections and the first vias are deleted from the newly laid first via pattern.

The second embodiment is characterized in that the fabrication process goes through the following two stages after those vias which do not meet the minimum allowable distances of the first metal interconnections and the first vias are deleted from the newly laid first via pattern at the eighth stage of the first embodiment, Stage at which the second metal interconnection pattern is additionally laid out in such a way as to completely cover the added first via pattern.

Stage at which those second metal interconnections which do not meet their minimum allowable distance are deleted from the newly laid second metal interconnections.

As the second embodiment designs a semiconductor device through the following stages, the embodiment can completely suppress the PID without sacrificing the characteristic of the semiconductor device.

(1) Stage at which the first metal interconnection pattern, first via pattern and second metal interconnection pattern are laid out in such a way that the antenna ratios become equal to or smaller than the allowable antenna ratio.

(2) Stage at which data processing is performed to make the first metal interconnection pattern evenly wider by the minimum line width of the first metal interconnections.

(3) Stage at which data processing is performed to connect the first metal interconnections at those areas where the distance of the first metal interconnections after the first data processing is smaller than the minimum size of first vias.

(4) Stage at which an area in a semiconductor device where the first metal interconnection pattern and the second metal interconnection pattern do not exist is extracted after the second data processing.

(5) Stage at which vias with the minimum size and minimum pitch are laid out as many as possible in the area extracted in (4).

(6) Stage at which those vias which do not meet the minimum allowable distances of the first metal interconnections and the first vias are deleted from the newly laid first via pattern.

(7) Stage at which the second metal interconnection pattern is additionally laid out in such a way as to completely cover the added first via pattern.

(8) Stage at which those second metal interconnections which do not meet their minimum allowable distance are deleted from the newly laid second metal interconnections.

Figure 2A:
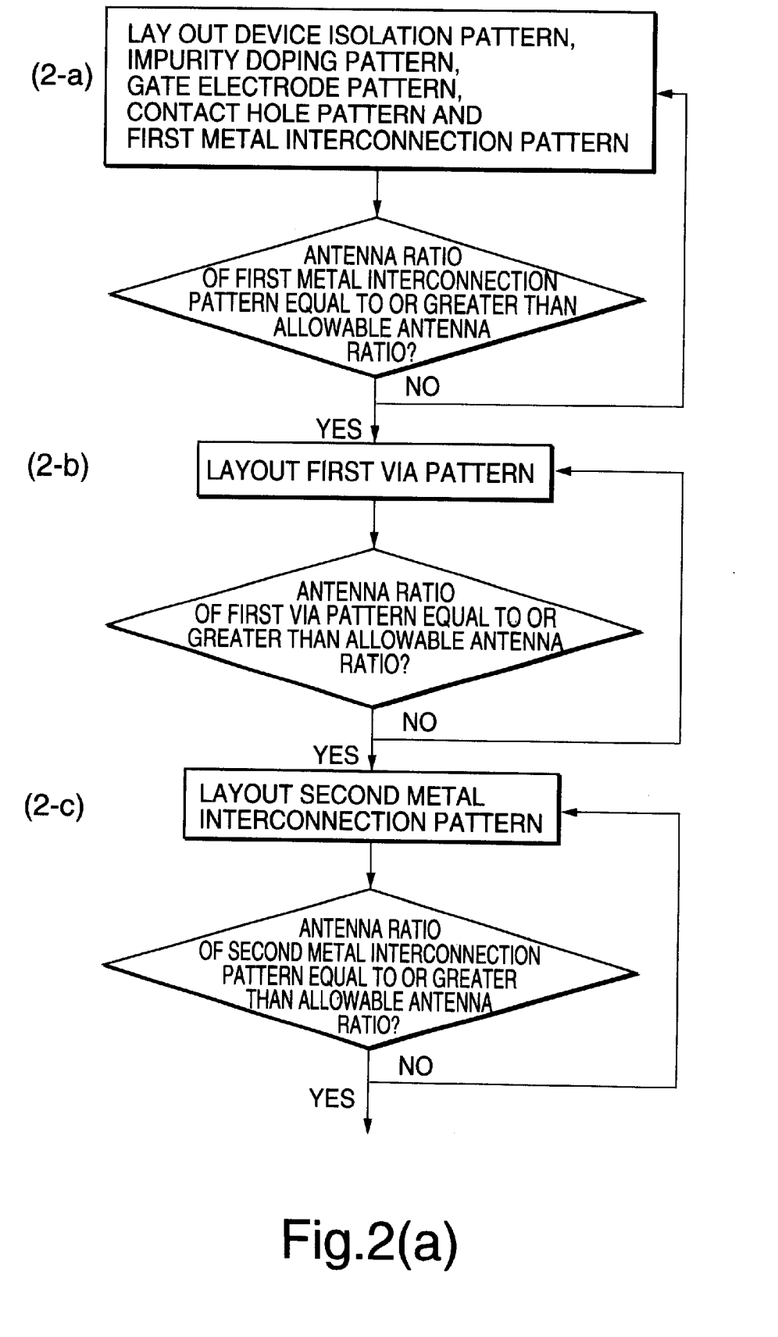
FIGS. 2A and 2B are flowcharts illustrating a third embodiment of the invention.
Figure 2B:
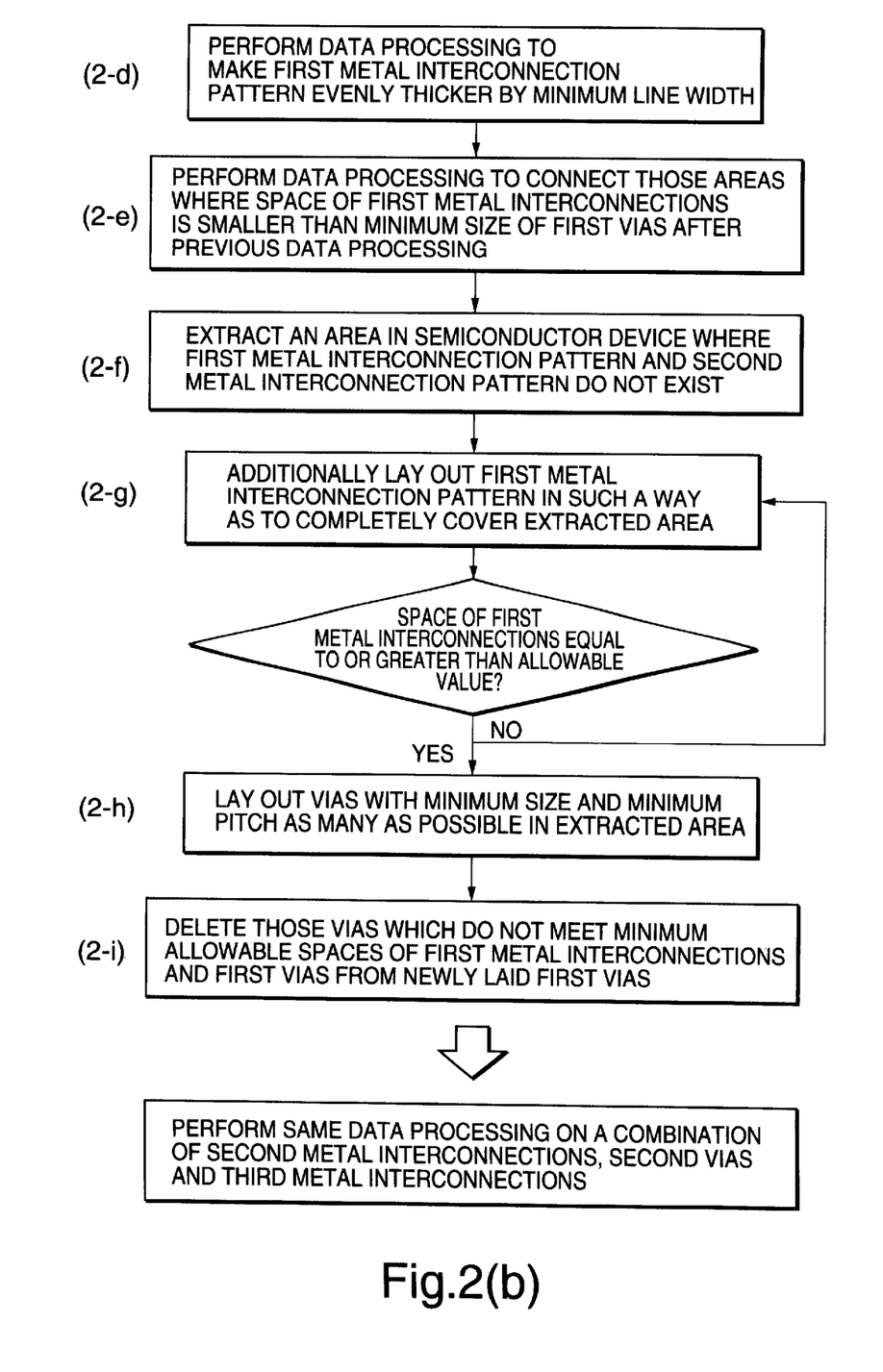

FIGS. 2A and 2B illustrate the third embodiment of the invention. The embodiment will now be described with reference to those drawings.

(2-a) A logic circuit which satisfies a given operation is laid out with a device isolation pattern, an impurity doping pattern, a gate electrode pattern, a contact hole pattern and a first metal interconnection pattern. The first metal interconnection pattern is so designed that its antenna ratio becomes equal to or smaller than an allowable antenna ratio.

(2-b) Then, a first via pattern for connecting the first metal interconnections to the second metal interconnections is laid out. The first via pattern is so designed that its antenna ratio becomes equal to or smaller than the allowable antenna ratio.

(2-c) A second metal interconnection pattern is then laid out. The second metal interconnection pattern is so designed that its antenna ratio becomes equal to or smaller than the allowable antenna ratio.

(2-d) Data processing is performed to make the first metal interconnection pattern evenly wider by the minimum line width of the first metal interconnections.

(2-e) Data processing is performed to connect the first metal interconnections at those areas where the distance of the first metal interconnections after the first data processing is smaller than the minimum size of first vias.

(2-f) After the second data processing, an area in a semiconductor device where the first metal interconnection pattern and the second metal interconnection pattern do not exist is extracted.

(2-g) The first metal interconnections are additionally laid out in such a way as to completely cover the extracted area.

(2-h) Those portions which do not meet the minimum allowable distances of the first metal interconnections and the first vias are deleted from the newly laid first metal interconnection pattern.

(2-i) Vias with the minimum size and minimum pitch are laid out as many as possible in the area of the added first metal interconnections.

(2-j) Those vias which do not meet the minimum allowable distances of the first metal interconnections and the first vias are deleted from the newly laid first via pattern.

Finally, in the third embodiment, the first metal interconnection patterns are fixed at the summation of the one in the first stage and the one obtained from the sixth to the eighth stages, and the first via patterns are fixed at the summation of the one in the second stage and the one obtained from the ninth to the tenth stages.

The semiconductor device is designed by repeating the second stage to the tenth stage until a predetermined number of interconnection levels is reached.

As the third embodiment designs a semiconductor device through the following stages, the embodiment can completely suppress the PID without sacrificing the characteristic of the semiconductor device.

(1) Stage at which the first metal interconnection pattern, first via pattern and second metal interconnection pattern are laid out in such a way that the antenna ratios become equal to or smaller than the allowable antenna ratio.

(2) Stage at which data processing is performed to make the first metal interconnection pattern evenly wider by the minimum line width of the first metal interconnections.

(3) Stage at which data processing is performed to connect the first metal interconnections at those areas where the distance of the first metal interconnections after the first data processing is smaller than the minimum size of first vias.

(4) Stage at which an area in a semiconductor device where the first metal interconnection pattern and the second metal interconnection pattern do not exist is extracted after the second data processing.

(5) Stage at which the first metal interconnections are additionally laid out in such a way as to completely cover the area extracted in (4).

(6) Stage at which those portions which do not meet the minimum allowable distance of the first metal interconnections are deleted from the newly laid first metal interconnection pattern.

(7) Stage at which vias with the minimum size and minimum pitch are laid out as many as possible in the area of the added first metal interconnections.

(8) Stage at which those vias which do not meet the minimum allowable distances of the first metal interconnections and the first vias are deleted from the newly laid first via pattern.

In addition, as the first metal interconnection pattern is laid out under the first via pattern to be added, it is possible to reliably stop etching of the first vias at the position of the first metal interconnections at the time of fabricating a semiconductor device according to the embodiment. This can provide a semiconductor device with a more stable production yield than the first embodiment.

The fourth embodiment is characterized in that the fabrication process goes through the following two stages after those vias which do not meet the minimum allowable distances of the first metal interconnections and the first vias are deleted from the newly laid first via pattern at the tenth stage of the third embodiment, Stage at which the second metal interconnection pattern is additionally laid out in such a way as to completely cover the added first via pattern.

Stage at which those second metal interconnections which do not meet their minimum allowable distance are deleted from the newly laid second metal interconnections.

As the fourth embodiment designs a semiconductor device through the following stages, the embodiment can completely suppress the PID without sacrificing the characteristic of the semiconductor device.

(1) Stage at which the first metal interconnection pattern, first via pattern and second metal interconnection pattern are laid out in such a way that the antenna ratios become equal to or smaller than the allowable antenna ratio.

(2) Stage at which data processing is performed to make the first metal interconnection pattern evenly wider by the minimum line width of the first metal interconnections.

(3) Stage at which data processing is performed to connect the first metal interconnections at those areas where the distance of the first metal interconnections after the first data processing is smaller than the minimum size of first vias.

(4) Stage at which an area in a semiconductor device where the first metal interconnection pattern and the second metal interconnection pattern do not exist is extracted after the second data processing.

(5) Stage at which the first metal interconnections are additionally laid out in such a way as to completely cover the area extracted in (4).

(6) Stage at which those portions which do not meet the minimum allowable distance of the first metal interconnections are deleted from the newly laid first metal interconnection pattern.

(7) Stage at which vias with the minimum size and minimum pitch are laid out as many as possible in the area of the added first metal interconnections.

(8) Stage at which those vias which do not meet the minimum allowable distances of the first metal interconnections and the first vias are deleted from the newly laid first via pattern.

(9) Stage at which the second metal interconnection pattern is additionally laid out in such a way as to completely cover the added first via pattern.

(10) Stage at which those second metal interconnections which do not meet their minimum allowable distance are deleted from the newly laid second metal interconnections.

In addition, as the first metal interconnection pattern is laid out under the first via pattern to be added, it is possible to reliably stop etching of the first vias at the position of the first metal interconnections at the time of fabricating a semiconductor device according to the embodiment. This can provide a semiconductor device with a more stable production yield than the first embodiment.

Figure 3A:
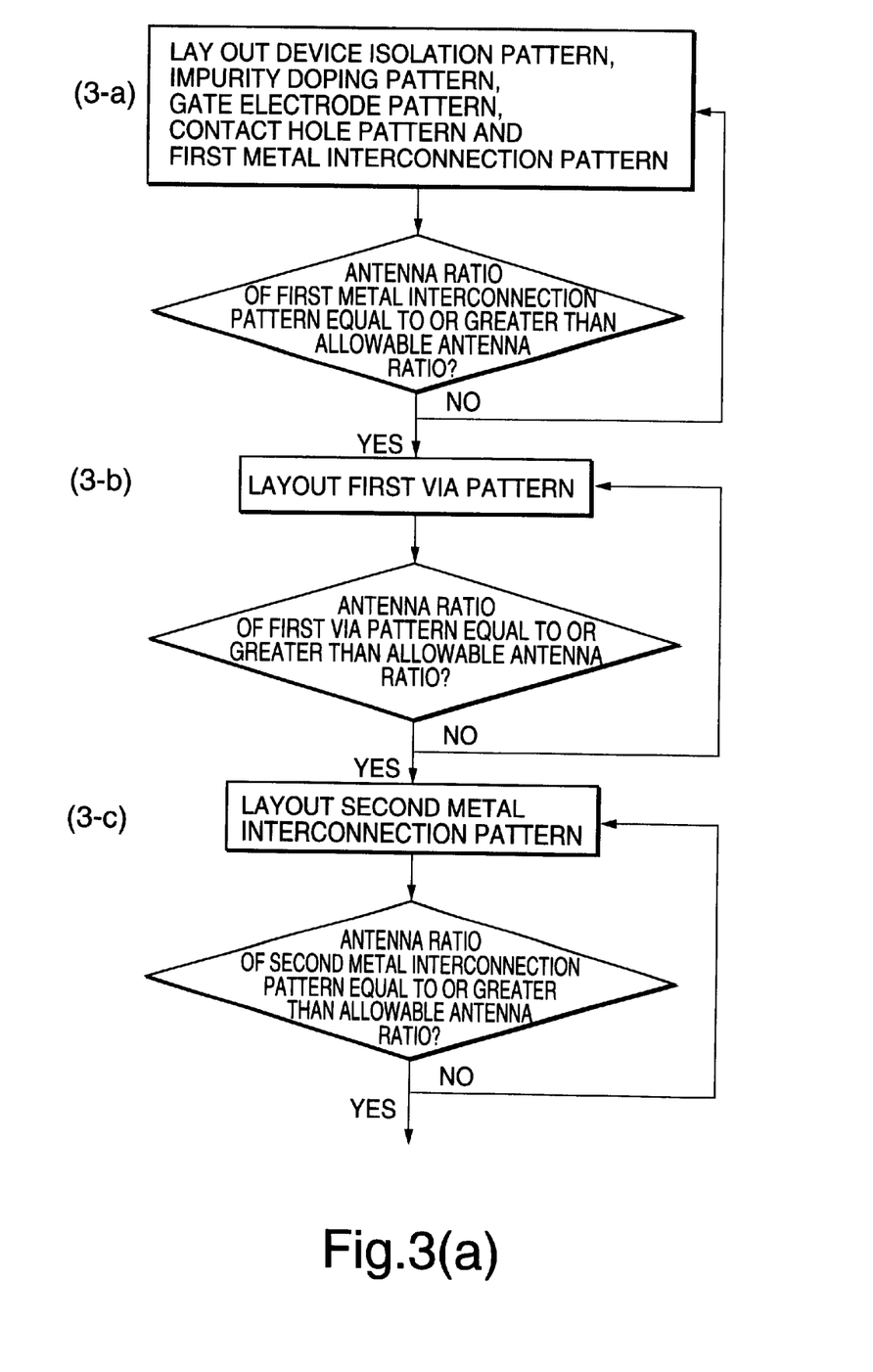
FIGS. 3A and 3B are flowcharts illustrating a fifth embodiment of the invention.
Figure 3B:
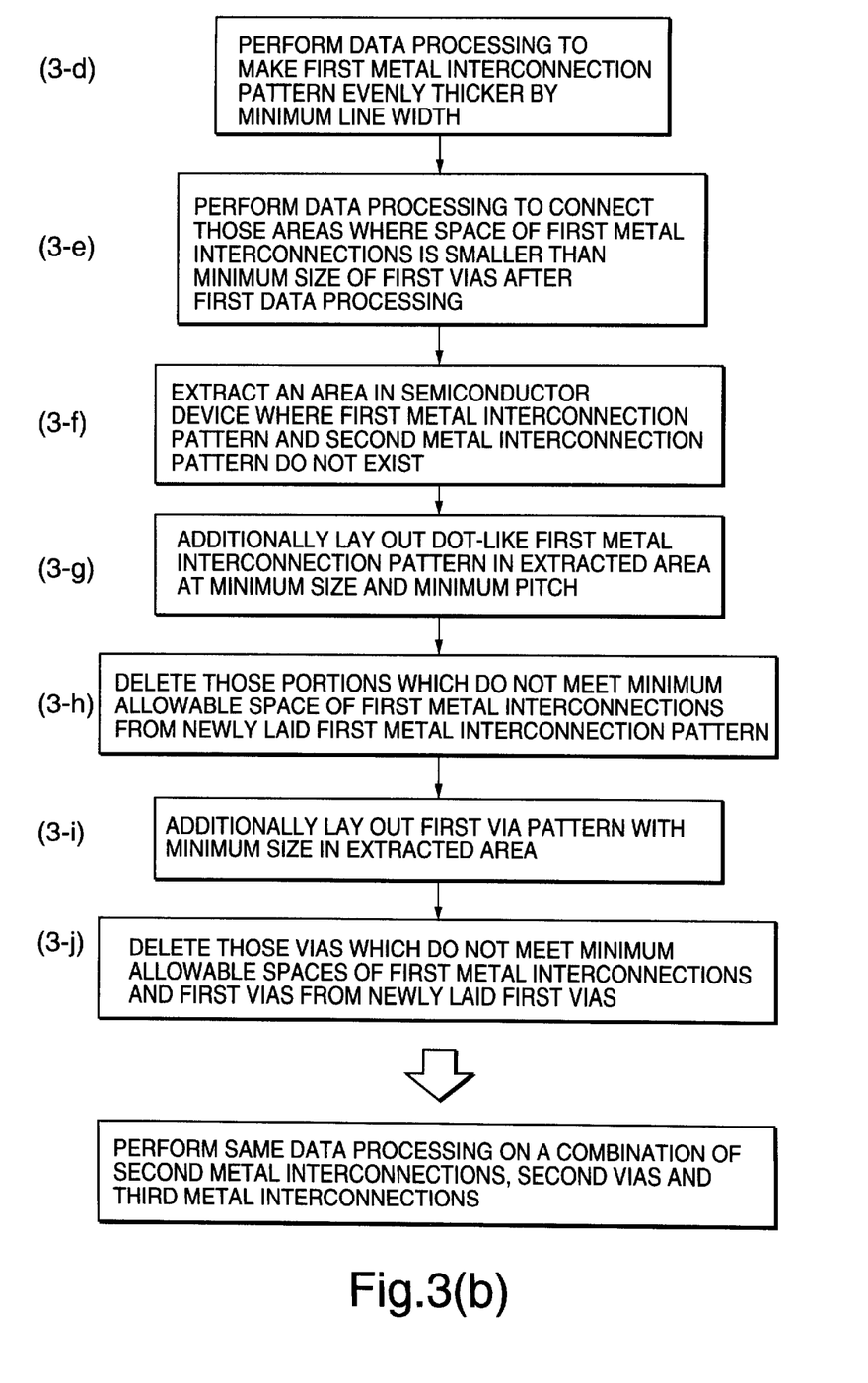

FIGS. 3A and 3B illustrate the fifth embodiment of the invention. The embodiment will now be described with reference to those drawings.

(3-a) A logic circuit which satisfies a given operation is laid out with a device isolation pattern, an impurity doping pattern, a gate electrode pattern, a contact hole pattern and a first metal interconnection pattern. The first metal interconnection pattern is so designed that its antenna ratio becomes equal to or smaller than an allowable antenna ratio.

(3-b) Then, a first via pattern for connecting the first metal interconnections to the second metal interconnections is laid out. The first via pattern is so designed that its antenna ratio becomes equal to or smaller than the allowable antenna ratio.

(3-c) A second metal interconnection pattern is then laid out. The second metal interconnection pattern is so designed that its antenna ratio becomes equal to or smaller than the allowable antenna ratio.

(3-d) Data processing is performed to make the first metal interconnection pattern evenly wider by the minimum line width of the first metal interconnections.

(3-e) Data processing is performed to connect the first metal interconnections at those areas where the distance of the first metal interconnections after the first data processing is smaller than the minimum size of first vias.

(3-f) After the second data processing, an area in a semiconductor device where the first metal interconnection pattern and the second metal interconnection pattern do not exist is extracted.

(3-g) The first metal interconnections are additionally laid out in the extracted area in the forms of dots at the minimum size and minimum pitch.

(3-h) Those portions which do not meet the minimum allowable distance of the first metal interconnections are deleted from the newly laid dot-like first metal interconnection pattern.

(3-i) Vias with the minimum size are laid out in the added first metal interconnection pattern.

(3-j) Those vias which do not meet the minimum allowable distances of the first metal interconnections and the first vias are deleted from the newly laid first via pattern.

Finally, in the fifth embodiment, the first metal interconnection patterns are fixed at the summation of the one in the first stage and the one obtained from the sixth to the eighth stages, and the first via patterns are fixed at the summation of the one in the second stage and the one obtained from the ninth to the tenth stages.

The semiconductor device is designed by repeating the second stage to the seventh stage until a predetermined number of interconnection levels is reached.

As the fifth embodiment designs a semiconductor device through the following stages, the embodiment can completely suppress the PID without sacrificing the characteristic of the semiconductor device.

(1) Stage at which the first metal interconnection pattern, first via pattern and second metal interconnection pattern are laid out in such a way that the antenna ratios become equal to or smaller than the allowable antenna ratio.

(2) Stage at which data processing is performed to make the first metal interconnection pattern evenly wider by the minimum line width of the first metal interconnections.

(3) Stage at which data processing is performed to connect the first metal interconnections at those areas where the distance of the first metal interconnections after the first data processing is smaller than the minimum size of first vias.

(4) Stage at which an area in a semiconductor device where the first metal interconnection pattern and the second metal interconnection pattern do not exist is extracted after the second data processing.

(5) Stage at which the first metal interconnections are additionally laid out in the area extracted in (4) in the forms of dots at the minimum size and minimum pitch.

(6) Stage at which those portions which do not meet the minimum allowable distance of the first metal interconnections are deleted from the newly laid dot-like first metal interconnection pattern.

(7) Stage at which vias with the minimum size are laid out as many as possible in the area of the added dot-like first metal interconnections.

(8) Stage at which those vias which do not meet the minimum allowable distances of the first metal interconnections and the first vias are deleted from the newly laid first via pattern.

In addition, as the first metal interconnection pattern is laid out under the first via pattern to be added, it is possible to reliably stop etching of the first vias at the position of the first metal interconnections at the time of fabricating a semiconductor device according to the embodiment. This can provide a semiconductor device with a more stable production yield than the first embodiment.

The sixth embodiment is characterized in that the fabrication process goes through the following two stages after those vias which do not meet the minimum allowable distances of the first metal interconnections and the first vias are deleted from the newly laid first via pattern at the tenth stage of the fifth embodiment, Stage at which the second metal interconnection pattern is additionally laid out in such a way as to completely cover the added first via pattern.

Stage at which those second metal interconnections which do not meet their minimum allowable distance are deleted from the newly laid second metal interconnections.

As the sixth embodiment designs a semiconductor device through the following stages, the embodiment can completely suppress the PID without sacrificing the characteristic of the semiconductor device.

(1) Stage at which the first metal interconnection pattern, first via pattern and second metal interconnection pattern are laid out in such a way that the antenna ratios become equal to or smaller than the allowable antenna ratio.

(2) Stage at which data processing is performed to make the first metal interconnection pattern evenly wider by the minimum line width of the first metal interconnections.

(3) Stage at which data processing is performed to connect the first metal interconnections at those areas where the distance of the first metal interconnections after the first data processing is smaller than the minimum size of first vias.

(4) Stage at which an area in a semiconductor device where the first metal interconnection pattern and the second metal interconnection pattern do not exist is extracted after the second data processing.

(5) Stage at which the first metal interconnections are additionally laid out in the area extracted in (4) in the forms of dots at the minimum size and minimum pitch.

(6) Stage at which those portions which do not meet the minimum allowable distance of the first metal interconnections are deleted from the newly laid dot-like first metal interconnection pattern.

(7) Stage at which vias with the minimum size are laid out as many as possible in the area of the added dot-like first metal interconnections.

(8) Stage at which those vias which do not meet the minimum allowable distances of the first metal interconnections and the first vias are deleted from the newly laid first via pattern.

(9) Stage at which the second metal interconnection pattern is additionally laid out in such a way as to completely cover the added first via pattern.

(10) Stage at which those second metal interconnections which do not meet their minimum allowable distance are deleted from the newly laid second metal interconnections.

In addition, as the first metal interconnection pattern is laid out under the first via pattern to be added, it is possible to reliably stop etching of the first vias at the position of the first metal interconnections at the time of fabricating a semiconductor device according to the embodiment. This can provide a semiconductor device with a more stable production yield than the first embodiment.

The seventh embodiment is characterized in that the fabrication process goes through the following two stages after those vias which do not meet the minimum allowable distances of the first metal interconnections and the first vias are deleted from the newly laid first via pattern at the tenth stage of the fifth embodiment, Stage at which the dot-like second metal interconnection pattern is additionally laid out in such a way as to cover the added first via pattern.

Stage at which those second metal interconnections which do not meet their minimum allowable distance are deleted from the newly laid second metal interconnections.

As the seventh embodiment designs a semiconductor device through the following stages, the embodiment can completely suppress the PID without sacrificing the characteristic of the semiconductor device.

(1) Stage at which the first metal interconnection pattern, first via pattern and second metal interconnection pattern are laid out in such a way that the antenna ratios become equal to or smaller than the allowable antenna ratio.

(2) Stage at which data processing is performed to make the first metal interconnection pattern evenly wider by the minimum line width of the first metal interconnections.

(3) Stage at which data processing is performed to connect the first metal interconnections at those areas where the distance of the first metal interconnections after the first data processing is smaller than the minimum size of first vias.

(4) Stage at which an area in a semiconductor device where the first metal interconnection pattern and the second metal interconnection pattern do not exist is extracted after the second data processing.

(5) Stage at which the first metal interconnections are additionally laid out in the area extracted in (4) in the forms of dots at the minimum size and minimum pitch.

(6) Stage at which those portions which do not meet the minimum allowable distance of the first metal interconnections are deleted from the newly laid dot-like first metal interconnection pattern.

(7) Stage at which vias with the minimum size are laid out as many as possible in the area of the added dot-like first metal interconnections.

(8) Stage at which those vias which do not meet the minimum allowable distances of the first metal interconnections and the first vias are deleted from the newly laid first via pattern.

(9) Stage at which the dot-like second metal interconnection pattern is additionally laid out in such a way as to cover the added first via pattern.

(10) Stage at which those second metal interconnections which do not meet their minimum allowable distance are deleted from the newly laid second metal interconnections.

In addition, as the first metal interconnection pattern is laid out under the first via pattern to be added, it is possible to reliably stop etching of the first vias at the position of the first metal interconnections at the time of fabricating a semiconductor device according to the embodiment. This can provide a semiconductor device with a more stable production yield than the first embodiment.

What is claimed is:

1. A method of fabricating a semiconductor device comprising the steps of:
   (a) positioning a plurality of first metal interconnection patterns, a plurality of first via patterns and a plurality of second metal interconnection patterns in such a way that each of antenna ratios of the first metal patterns, the first via patterns and the second metal patterns becomes equal to or smaller than an allowable antenna ratio;
   (b) broadening a width of each of the first metal patterns by a minimum line width of the first metal patterns;
   (c) connecting the broadened first metal patterns at a first area where a distance between the broadened first metal patterns is smaller than a minimum size of the first via patterns;
   (d) after the step (c), extracting a second area where the first metal patterns and the second metal patterns do not exist;
   (e) placing a plurality of additional first via patterns each having a minimum size with a minimum pitch in the second area; and
   (f) deleting the additional first via pattern which do not meet a minimum allowable distance between the first metal patterns and the first via patterns positioned in the step (a).

2. A method of fabricating a semiconductor device according to claim 1, further comprising the steps of:
   (g) positioning a plurality of third metal interconnection patterns, a plurality of second via patterns and the second metal patterns in such a way that each of antenna ratios of the third metal patterns, the second via patterns and the second metal patterns becomes equal to or smaller than an allowable antenna ratio;
   (h) broadening a width of each of the second metal patterns by a minimum line width of the second metal patterns;
   (i) connecting the broadened second metal patterns at a third area where a distance between the broadened second metal patterns is smaller than a minimum size of the second via patterns;
   (j) after the step (i), extracting a fourth area where the second metal patterns and the third metal patterns do not exist;
   (k) placing a plurality of additional second via patterns each having a minimum size with a minimum pitch in the fourth area; and (l) deleting the additional second via pattern which do not meet a minimum allowable distance between the second metal patterns and the second via patterns positioned in the step (g).

3. A method of fabricating a semiconductor device according to claim 1, further comprising the steps of:
(g) positioning an additional second metal pattern to completely cover the additional first via pattern; and
(h) deleting the additional second metal pattern which do not meet a minimum allowable distance between the second metal patterns positioned in the step (a).

4. A method of fabricating a semiconductor device according to claim 3, further comprising the steps of:
(i) positioning a plurality of third metal interconnection patterns, a plurality of second via patterns and the second metal patterns in such a way that each of antenna ratios of the third metal patterns, the second via patterns and the second metal patterns becomes equal to or smaller than an allowable antenna ratio;
(j) broadening a width of each of the second metal patterns by a minimum line width of the second metal patterns;
(k) connecting the broadened second metal patterns at a third area where a distance between the broadened second metal patterns is smaller than a minimum size of the second via patterns;
(l) after the step (k), extracting a fourth area where the second metal patterns and the third metal patterns do not exist;
(m) placing a plurality of additional second via patterns each having a minimum size with a minimum pitch in the fourth area;
(n) deleting the additional second via pattern which do not meet a minimum allowable distance between the second metal patterns and the second via patterns positioned in the step (i);
(o) positioning an additional third metal pattern to completely cover the additional second via pattern; and
(p) deleting the additional third metal pattern which do not meet a minimum allowable distance between the third metal patterns.

5. A method of fabricating a semiconductor device comprising the steps of:
(a) positioning a plurality of first metal interconnection patterns, a plurality of first via patterns and a plurality of second metal interconnection patterns in such a way that each of antenna ratios of the first metal patterns, the first via patterns and the second metal patterns becomes equal to or smaller than an allowable antenna ratio;
(b) broadening a width of each of the first metal patterns by a minimum line width of the first metal patterns;
(c) connecting the broadened first metal patterns at a first area where a distance between the broadened first metal patterns is smaller than a minimum size of the first via patterns;
(d) after the step (c), extracting a second area where the first metal patterns and the second metal patterns do not exist;
(e) positioning an additional first metal pattern to completely cover the second area;
(f) deleting a portion of the additional first metal pattern which do not meet a minimum allowable distance between the first metal patterns positioned in the step (a);

(g) placing a plurality of additional first via patterns each having a minimum size with a minimum pitch in an area where the additional first metal pattern is positioned; and
(h) deleting the additional first via pattern which do not meet a minimum allowable distance between the first metal patterns and the first via patterns positioned in the step (a).

6. A method of fabricating a semiconductor device according to claim 5, further comprising the steps of:
(i) positioning a plurality of third metal interconnection patterns, a plurality of second via patterns and the second metal patterns in such a way that each of antenna ratios of the third metal patterns, the second via patterns and the second metal patterns becomes equal to or smaller than an allowable antenna ratio;
(j) broadening a width of each of the second metal patterns by a minimum line width of the second metal patterns;
(k) connecting the broadened second metal patterns at a third area where a distance between the broadened second metal patterns is smaller than a minimum size of the second via patterns;
(l) after the step (k), extracting a fourth area where the second metal patterns positioned in the step (i) and the third metal patterns positioned in the step (i) do not exist;
(m) positioning an additional second metal pattern to completely cover the fourth area;
(n) deleting a portion of the additional second metal pattern which do not meet a minimum allowable distance between the second metal patterns positioned in the step (i);
(o) placing a plurality of additional second via patterns each having a minimum size with a minimum pitch in an area where the additional second metal pattern is positioned; and
(p) deleting the additional second via pattern which do not meet a minimum allowable distance between the second metal patterns and the second via patterns positioned in the step (i).

7. A method of fabricating a semiconductor device according to claim 5, further comprising the steps of:
(i) positioning an additional second metal pattern to completely cover the additional first via pattern; and
(j) deleting the additional second metal pattern which do not meet a minimum allowable distance between the second metal patterns positioned in the step (a).

8. A method of fabricating a semiconductor device according to claim 7, further comprising the steps of:
(k) positioning a plurality of third metal interconnection patterns, a plurality of second via patterns and the second metal patterns in such a way that each of antenna ratios of the third metal patterns, the second via patterns and the second metal patterns becomes equal to or smaller than an allowable antenna ratio;
(l) broadening a width of each of the second metal patterns by a minimum line width of the second metal patterns;
(m) connecting the broadened second metal patterns at a third area where a distance between the broadened second metal patterns is smaller than a minimum size of the second via patterns;
(n) after the step (m), extracting a fourth area where the second metal patterns and the third metal patterns do not exist;

(o) positioning an extra additional second metal pattern to completely cover the fourth area;

(p) deleting a portion of the extra additional second metal pattern which do not meet a minimum allowable distance between the second metal patterns positioned in the step (k);

(q) placing a plurality of additional second via patterns each having a minimum size with a minimum pitch in an area where the extra additional second metal pattern is positioned;

(r) deleting the additional second via pattern which do not meet a minimum allowable distance between the second metal patterns and the second via patterns positioned in the step (k);

(s) positioning an additional third metal pattern to completely cover the additional second via pattern; and (t) deleting the additional third metal pattern which do not meet a minimum allowable distance between the third metal patterns positioned in the step (k).

9. A method of fabricating a semiconductor device comprising the steps of:

(a) positioning a plurality of first metal interconnection patterns, a plurality of first via patterns and a plurality of second metal interconnection patterns in such a way that each of antenna ratios of the first metal patterns, the first via patterns and the second metal patterns becomes equal to or smaller than an allowable antenna ratio;

(b) broadening a width of each of the first metal patterns by a minimum line width of the first metal patterns;

(c) connecting the broadened first metal patterns at a first area where a distance between the broadened first metal patterns is smaller than a minimum size of the first via patterns;

(d) after the step (c), extracting a second area where the first metal patterns and the second metal patterns do not exist;

(e) positioning a plurality of additional first metal patterns each having a minimum size with a minimum pitch in a form of dots in the second area;

(f) deleting a portion of the additional first metal patterns which do not meet a minimum allowable distance between the first metal patterns positioned in the step (a);

(g) placing an additional first via patterns each having a minimum size in an area where the additional first metal patterns are positioned; and (h) deleting the additional first via pattern which do not meet a minimum allowable distance between the first metal patterns and the first via patterns positioned in the step (a).

10. A method of fabricating a semiconductor device according to claim 9, further comprising the steps of:

(i) positioning a plurality of third metal interconnection patterns, a plurality of second via patterns and the second metal patterns in such a way that each of antenna ratios of the third metal patterns, the second via patterns and the second metal patterns becomes equal to or smaller than an allowable antenna ratio;

(j) broadening a width of each of the second metal patterns by a minimum line width of the second metal patterns;

(k) connecting the broadened second metal patterns at a third area where a distance between the broadened second metal patterns is smaller than a minimum size of the second via patterns;

(l) after the step (k), extracting a fourth area where the second metal patterns and the third metal patterns do not exist;

(m) positioning a plurality of additional second metal patterns each having a minimum size with a minimum pitch in a form of dots in the fourth area;

(n) deleting a portion of the additional second metal patterns which do not meet a minimum allowable distance between the second metal patterns positioned in the step (i);

(o) placing an additional second via patterns each having a minimum size in an area where the additional second metal patterns are positioned; and (p) deleting the additional second via pattern which do not meet a minimum allowable distance between the second metal patterns and the second via patterns positioned in the step (i).

11. A method of fabricating a semiconductor device according to claim 9, further comprising the steps of:

(i) positioning an additional second metal pattern to completely cover the additional first via pattern; and (j) deleting the additional second metal pattern which do not meet a minimum allowable distance between the second metal patterns positioned in the step (a).

12. A method of fabricating a semiconductor device according to claim 11, further comprising the steps of:

(k) positioning a plurality of third metal interconnection patterns, a plurality of second via patterns and the second metal patterns in such a way that each of antenna ratios of the third metal patterns, the second via patterns and the second metal patterns becomes equal to or smaller than an allowable antenna ratio;

(l) broadening a width of each of the second metal patterns by a minimum line width of the second metal patterns;

(m) connecting the broadened second metal patterns at a third area where a distance between the broadened second metal patterns is smaller than a minimum size of the second via patterns;

(n) after the step (k), extracting a fourth area where the second metal patterns and the third metal patterns do not exist;

(o) positioning a plurality of extra additional second metal patterns each having a minimum size with a minimum pitch in a form of dots in the fourth area;

(p) deleting a portion of the extra additional second metal patterns which do not meet a minimum allowable distance between the second metal patterns positioned in the step (k);

(q) placing an additional second via patterns each having a minimum size in an area where the extra additional second metal patterns are positioned;

(r) deleting the additional second via pattern which do not meet a minimum allowable distance between the second metal patterns and the second via patterns positioned in the step (k);

(s) positioning an additional third metal pattern to completely cover the additional second via pattern; and (t) deleting the additional third metal pattern which do not meet a minimum allowable distance between the third metal patterns positioned in the step (k).

13. A method of fabricating a semiconductor device according to claim 9, further comprising the steps of:

(i) positioning an additional second metal pattern in a form of dots to cover the additional first via pattern; and (j) deleting the additional second metal pattern which do not meet a minimum allowable distance between the second metal patterns positioned in the step (a).

14. A method of fabricating a semiconductor device according to claim 13, further comprising the steps of:

(k) positioning a plurality of third metal interconnection patterns, a plurality of second via patterns and the second metal patterns in such a way that each of antenna ratios of the third metal patterns, the second via patterns and the second metal patterns becomes equal to or smaller than an allowable antenna ratio;

(l) broadening a width of each of the second metal patterns by a minimum line width of the second metal patterns;

(m) connecting the broadened second metal patterns at a third area where a distance between the broadened second metal patterns is smaller than a minimum size of the second via patterns;

(n) after the step (k), extracting a fourth area where the second metal patterns and the third metal patterns do not exist;

(o) positioning a plurality of extra additional second metal patterns each having a minimum size with a minimum pitch in a form of dots in the fourth area;

(p) deleting a portion of the extra additional second metal patterns which do not meet a minimum allowable distance between the second metal patterns positioned in the step (k);

(q) placing an additional second via patterns each having a minimum size in an area where the additional second metal patterns are positioned;

(r) deleting the additional second via pattern which do not meet a minimum allowable distance between the second metal patterns and the second via patterns positioned in the step (k);

(s) positioning an additional third metal pattern in a form of dots to cover the additional second via pattern; and (t) deleting the additional third metal pattern which do not meet a minimum allowable distance between the third metal patterns positioned in the step (k).

* * * * *